(12) United States Patent
Turudic et al.

(10) Patent No.: US 6,359,948 B1
(45) Date of Patent: Mar. 19, 2002

(54) PHASE-LOCKED LOOP CIRCUIT WITH REDUCED JITTER

(75) Inventors: Andy Turudic, Hillsboro; David E. McNeill, Beaverton, both of OR (US)

(73) Assignee: TriQuint Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 09/251,703

(22) Filed: Feb. 17, 1999

(51) Int. Cl.$^7$ .................................................. H03D 3/24
(52) U.S. Cl. ............................. 375/376; 327/3; 327/40
(58) Field of Search ................................ 375/215, 294, 375/327, 376; 329/307, 325, 360; 331/25, 51; 332/127; 370/503; 327/3, 5, 8, 21, 40

(56) References Cited

U.S. PATENT DOCUMENTS

| 4,087,677 A | 5/1978 | Dunn et al. ................... 325/30 |
| 4,590,602 A | 5/1986 | Wolaver ...................... 375/120 |

FOREIGN PATENT DOCUMENTS

| EP | 0 788 240 | 8/1997 | ............ H03M/9/00 |
| EP | 0 841 754 | 5/1998 | ........... H03L/7/099 |
| JP | 01 254021 | 10/1989 | ........... H03K/23/40 |

Primary Examiner—Chi Pham
Assistant Examiner—Emmanuel Bayard
(74) Attorney, Agent, or Firm—Skjerven Morrill MacPherson LLP; Daniel P. Stewart

(57) ABSTRACT

An improved phase-locked loop circuit includes a variable-frequency oscillator that generates a first oscillator signal, a reference signal source that generates a second oscillator signal, a control block that generates a select signal, and a frequency divider that receives as an input signal one of the first and second oscillator signals. The frequency divider also receives the select signal from the control block. The frequency divider generates a plurality of frequency-divided signals in response to the input signal, and passes through a selected one of the plurality of frequency-divided signals as an output signal in response to the select signal. The frequency divider also synchronizes its output signal to its input signal. The phase-locked loop also includes a frequency comparator that receives the output signal of the frequency divider and a signal derived from one of the first and second oscillator signals. The frequency comparator compares the output signal of the frequency divider to the signal derived from one of the first and second oscillator signals, and provides a feedback signal to the variable-frequency oscillator reflecting this comparison. In this phase-locked loop circuit, the number of signal regenerators introduced by the programmable frequency divider is effectively limited to one, thereby reducing the jitter introduced by the frequency divider.

13 Claims, 2 Drawing Sheets

PHASE-LOCKED LOOP CIRCUIT WITH REDUCED JITTER

TECHNICAL FIELD OF THE INVENTION

The present invention relates to logic circuits, and in particular to a phase-locked loop circuit with reduced jitter.

BACKGROUND OF THE INVENTION

Phase-locked loop (PLL) circuits are used for a variety of purposes, including signal demodulation, frequency synthesis, pulse synchronization of signals from mass storage devices, and regeneration of "clean" signals. A PLL circuit typically compares a variable-frequency signal to a reference signal to determine a frequency difference, which is then fed back to the variable-frequency signal generator to synchronize the two signals. Often, logic circuit elements such as frequency dividers are placed between at least one of the two signal sources and the frequency comparator. Each such intervening logic circuit element, known as a regenerator, has an uncertainty in its output signal timing and therefore contributes to an overall signal timing uncertainty in the PLL circuit, thereby contributing to jitter in the phase-locked loop.

To increase the versatility of a phase-locked loop circuit, it is desirable to introduce flexibility in the frequency divide ratios used to generate the signals used by the frequency comparator. This requires the introduction of multiplexers after the frequency dividers to select the signal with the desired frequency division ratio. These multiplexers are also regenerators, further contributing to the jitter of the phase-locked loop circuit.

SUMMARY OF THE INVENTION

Therefore, a need has arisen for a phase-locked loop circuit that addresses the disadvantages and deficiencies of the prior art. In particular, a need has arisen for a phase-locked loop circuit with selectable frequency divide ratios and reduced jitter.

Accordingly, an improved phase-locked loop circuit is disclosed. In one embodiment, the phase-locked loop circuit includes a variable-frequency oscillator that generates a first oscillator signal, a reference signal source that generates a second oscillator signal, a control block that generates a select signal, and a frequency divider that receives as an input signal one of the first and second oscillator signals. The frequency divider also receives the select signal from the control block. The frequency divider generates a plurality of frequency-divided signals in response to the input signal, and selects a selected one of the plurality of frequency-divided signals as an output signal in response to the select signal. The frequency divider also synchronizes its output signal to its input signal. The phase-locked loop also includes a frequency comparator that receives the output signal of the frequency divider and a signal derived from one of the first and second oscillator signals. The frequency comparator compares the output signal of the frequency divider to the signal derived from one of the first and second oscillator signals, and provides a feedback signal to the variable-frequency oscillator reflecting this comparison.

An advantage of the present invention is that, while a programmable frequency divider is used to maximize the flexibility of the phase-locked loop circuit, the number of regenerators introduced by the frequency divider is effectively limited to one, thereby reducing the jitter caused by the frequency divider.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF THE INVENTION

Figure 1:
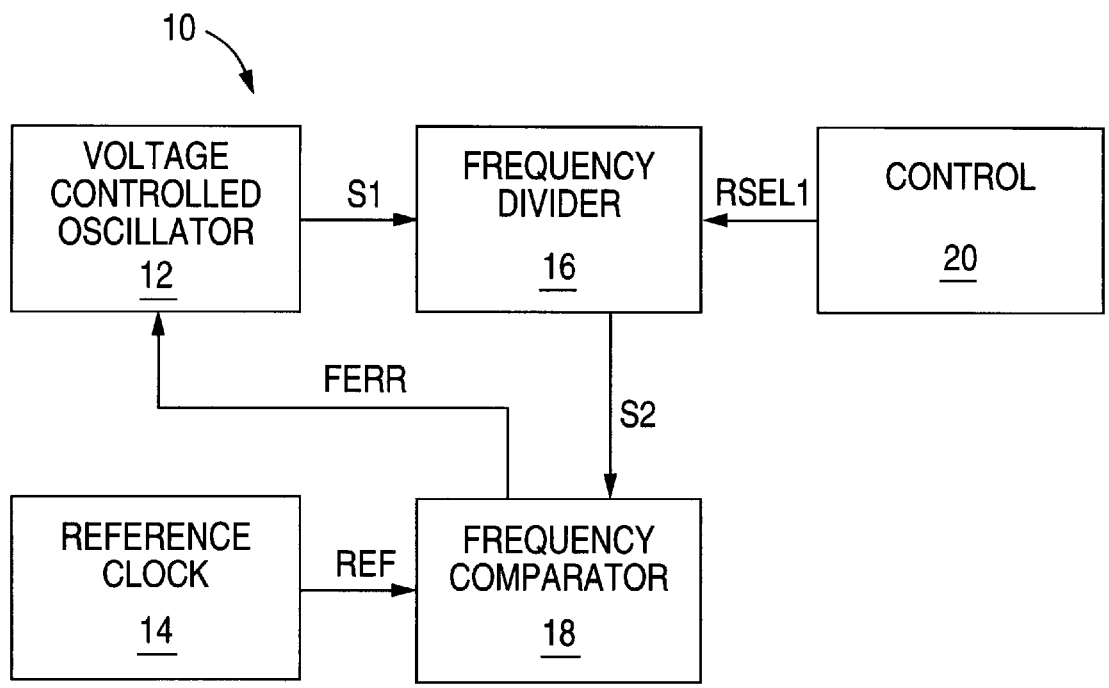
FIG. 1 is a block diagram of a phase-locked loop circuit constructed in accordance with the present invention.
Figure 2:
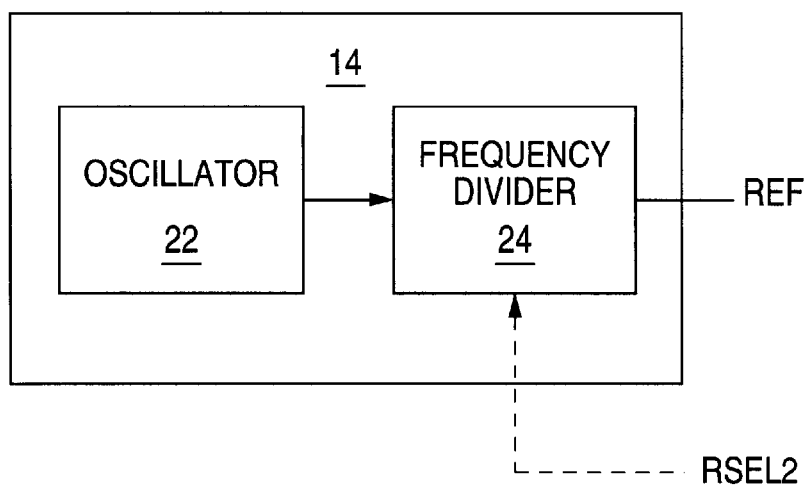
FIG. 2 is a block diagram of one embodiment of a reference clock source for use in the phase-locked loop circuit.
Figure 3:
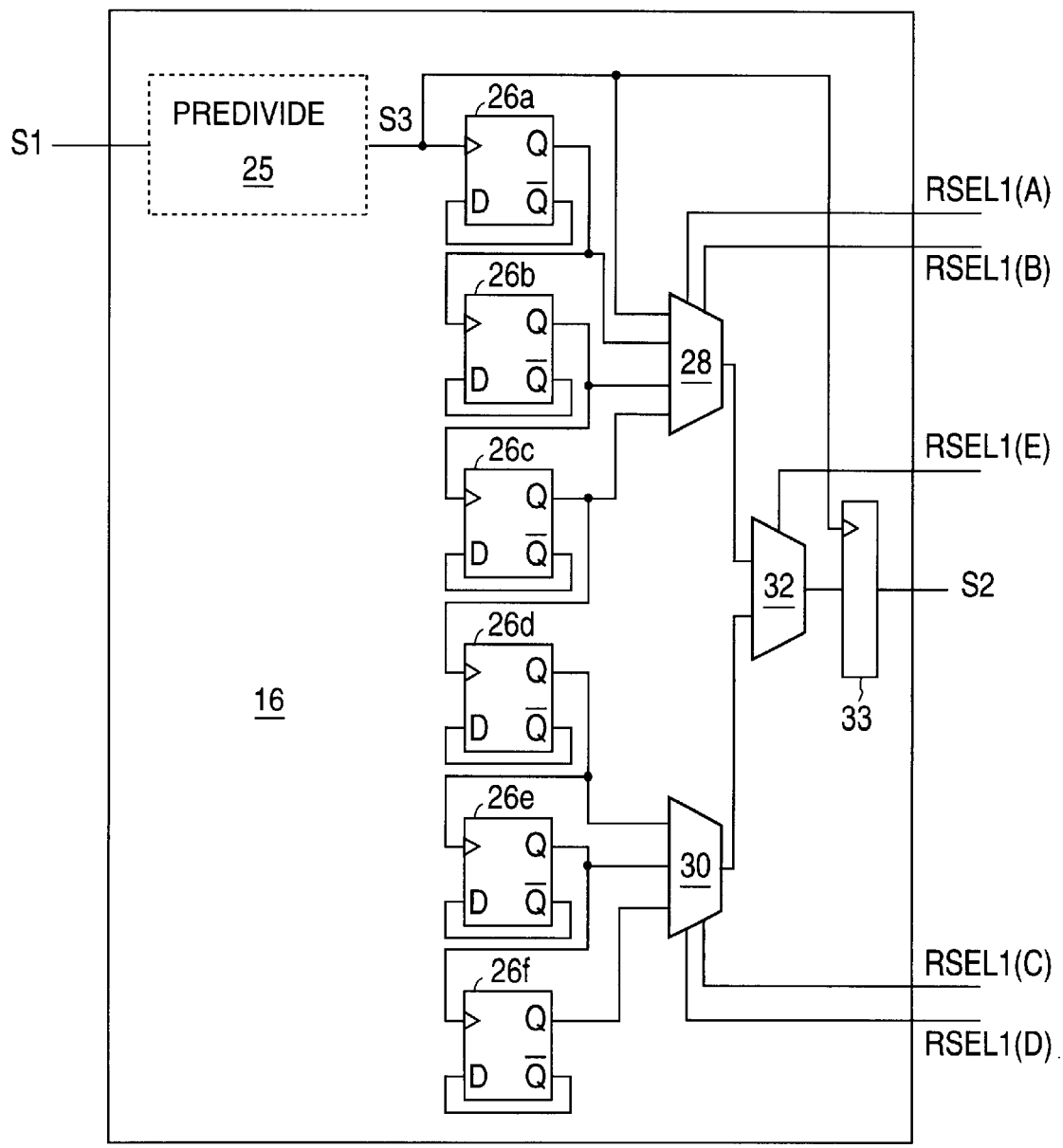
FIG. 3 is a block diagram of a frequency divider for use in the phase-locked loop circuit.

The preferred embodiments of the present invention and their advantages are best understood by referring to FIGS. 1, 2 and 3 of the drawings. Like numerals are used for like and corresponding parts of the various drawings.

Referring to FIG. 1, a block diagram of a phase-locked loop (PLL) circuit 10 is shown. PLL circuit 10 includes a voltage-controlled oscillator (VCO) 12, a reference clock source 14, a programmable frequency divider 16, a frequency comparator 18 and a control block 20.

Reference clock source 14 provides a reference clock signal REF to frequency comparator 18. In one embodiment, illustrated in FIG. 2, reference clock source 14 includes an oscillator 22 and a frequency divider 24. Frequency divider 24 reduces the frequency of the output signal from oscillator 22 by a predetermined ratio. Frequency divider 24 may be a programmable frequency divider constructed in a manner similar to frequency divider 16, described below, in which case frequency divider 24 receives a ratio select signal RSEL2 from control block 20.

Voltage-controlled oscillator 12 provides a variable-frequency oscillating signal (S1) to frequency divider 16. VCO 12 may be any standard voltage-controlled oscillator, the design of which is well known in the art, or any other type of controlled, variable-frequency oscillator.

Frequency divider 16 reduces the frequency of the signal from VCO 12 by a selected ratio, which is determined by a ratio select signal RSEL1 from control block 20. This ratio is preferably selected so that the frequency of the output signal from frequency divider 16 approximately matches the frequency of the output signal from reference clock source 14, or one of its harmonics. The output of frequency divider 16 (S2) is provided to frequency comparator 18. The design and operation of frequency divider 16 will be described more fully below.

Frequency comparator 18 compares the frequency of reference clock signal REF and variable-frequency signal S2. This may be accomplished by continually comparing the phases of the two signals in a manner well known to those skilled in the art of phase-locked loops. Alternatively, any other well-known frequency comparison method may be used. The resulting frequency error signal FERR is provided as feedback to VCO 12 to adjust the frequency of its output signal. In this manner, VCO 12 is adjusted to produce an output signal with a frequency that is as near as possible to a multiple of the frequency of reference clock signal REF.

Referring to FIG. 3, a block diagram of frequency divider 16 is shown. Frequency divider 16 includes an optional predivide block 25 and a series of frequency divide blocks 26a through 26f. Output signal S1 from VCO 12 is optionally provided to predivide block 25, which divides the frequency of signal S1 by a predetermined ratio. In this example, a predivide block 25 with a division ratio of four is used. It will be understood, however, that predivide block 25 is not essential to the operation of the invention described herein.

The output signal S3 from predivide block 25 is provided to the data input of frequency divide block 26a. Alternatively, if no frequency predivision is necessary, signal S1 is provided directly to the data input of frequency divide block 26a. Each frequency divide block 26a through 26f reduces the frequency of its input signal by a predetermined ratio, such as two, to produce an output signal.

In the example shown in FIG. 3, each frequency divide block 26a through 26f is a D flip-flop, with its inverted output signal Q-bar tied to its data input signal D. In this arrangement, each frequency divide block 26a through 26f generates an output signal Q which has a frequency equal to half that of its clock input signal. Thus, each frequency divide block 26b through 26f receives as its clock input signal the output signal Q from the previous frequency divide block 26a through 26e in the series. In this example, the output signal Q from frequency divide block 26f will have a frequency that is equal to the frequency of signal S3 divided by 64.

While D flip-flops have been used to illustrate one embodiment of the present invention, it will be appreciated that each frequency divide block 26a through 26f may comprise any other logic circuitry, including but not limited to a JK flip-flop, configured to reduce the frequency of an input signal by a predetermined ratio.

In one alternative embodiment, a synchronous divider chain may be implemented. In this embodiment, frequency divide blocks 26a through 26f are all clocked by a common clock signal, such as signal S3. Each frequency divide block 26b through 26f may then receive as imput signals the output signals from all of the preceding frequency divide blocks in the chain. Each frequency divide block 26b through 26f may be configured, using appropriate logic circuitry, to toggle its output when the output signals from all preceding frequency divide blocks are HIGH. It will be appreciated that this type of synchronous divider chain, which is well known to those skilled in the art, provides a reduction in frequency by a factor of two at each frequency divide block in the chain. However, the advantages of the present invention may be realized with or without the use of a synchronous divider chain.

It will also be appreciated that the divide ratio of each frequency divide block need not be the same as that of all the other frequency divide blocks. For example, a divide-by-3 block may be used in one or more frequency divide block 26a through 26f. In addition, the number of frequency divide blocks may be altered to suit any particular implementation, for example to achieve a greater total frequency divide ratio or to reduce the number of integrated circuit components that constitute frequency divider 16.

Signal S3 and the output signals from frequency divide blocks 26a, 26b and 26c are provided to the data inputs of a 4-to-1 multiplexer 28. Select signals RSEL1(A) and RSEL1(B) from control block 20 determine which of the input signals is passed through as the output of multiplexer 28.

Likewise, the outputs of frequency divide blocks 26d, 26e and 26f are provided to three of the data inputs of a 4-to-1 multiplexer 30. Select signals RSEL1(C) and RSEL1(D) from control block 20 determine which of the input signals is passed through as the output of multiplexer 30. It will be understood that, for purposes of economy in signal routing, signal RSEL1(C) may be identical to signal RSEL1(A), and signal RSEL1(D) may be identical to signal RSEL1(B).

The output signals from multiplexers 28 and 30 are provided to the inputs of a 2-to-1 multiplexer 32. Select signal RSEL1(E) from control block 20 determines which of the input signals is passed through as the output signal S2 of frequency divider 16.

The output of multiplexer 32 is received by a retiming device 33. Retiming device 33 may be, for example, a flip-flop or some other signal latching mechanism that produces an output signal S2 that corresponds to the input signal received from multiplexer 32. Retiming device 33 also receives a clock signal that synchronizes the output of retiming device 33 to signal S1 from VCO 12. In this example, the clock signal received by retiming device 33 is the output signal S3 from predivide block 25. It will be understood, however, that signal S1 from VCO 12 may be used as a clock signal for retiming device 33, particularly in an embodiment in which predivide block 25 is not implemented.

Multiplexers 28, 30 and 32 allow control block 20 to select any one of seven different frequency divide ratios for the output of frequency divider 16. Two stages of multiplexing are shown here because some integrated circuit technologies allow the stacking of a limited number of logic levels, thereby limiting the maximum size of a single multiplexer to 4-to-1, or in some cases 2-to-1. Thus, it will be understood that, in some technologies, it may be possible to alternatively implement multiplexers 28, 30 and 32 as a single 8-to-1 (or 7-to-1) multiplexer. Alternatively, in some technologies each multiplexer 28 or 30 may be implemented as three 2-to-1 multiplexers. Regardless of the implementation, it will be understood that the advantages provided by the present invention and described below may be realized by providing a synchronizing clock signal to a retiming device 33 following the final output multiplexer 32.

The use of a clock signal to synchronize or retime the output of frequency divider 16 effectively reduces the number of regenerators between signal S3 and frequency comparator 18 to one, namely retiming device 33. In the embodiment in which predivide block 25 is not implemented, the number of regenerators between VCO 12 and frequency comparator 18 is effectively reduced to one. This significantly reduces the uncertainty in the timing of the output signal S2 from frequency divider 16, thereby reducing the jitter in PLL circuit 10. Thus, PLL circuit 10 provides the advantages of flexibility in the frequency divide ratio used and a very low level of jitter.

It will be understood that, in some logic design technologies such as source-coupled FET logic (SCFL), each of the signals described herein may be a complementary, differential pair of logic signals. Furthermore, although the present invention and its advantages have been described in detail, it should be understood that various changes, substitutions, and alterations can be made therein without departing from the spirit and scope of the invention as defined by the appended claims.

We claim:

1. A phase-locked loop comprising:
   a variable-frequency oscillator operable to generate a first oscillator signal;
   a reference signal source operable to generate a second oscillator signal;
   a control block operable to generate a select signal;
   a frequency divider operable to receive as an input signal a first selected one of the first and second oscillator signals, and operable to receive the select signal from the control block, and operable to generate a plurality of frequency-divided signals in response to the first selected one of the first and second oscillator signals, and operable to provide a selected one of the plurality of frequency-divided signals as an output signal in response to the select signal, and operable to synchronize the output signal to the first selected one of the first and second oscillator signals; and a frequency comparator operable to receive the output signal of the frequency divider, and operable to receive a signal derived from a second selected one of the first and second oscillator signals, and operable to compare the output signal of the frequency divider to the signal derived from the second selected one of the first and second oscillator signals, and operable to provide a feedback signal to the variable-frequency oscillator in response to the comparison of the output signal of the frequency divider to the signal derived from the second selected one of the first and second oscillator signals.

2. The phase-locked loop of claim 1, wherein the signal derived from the second selected one of the first and second oscillator signals comprises the second selected one of the first and second oscillator signals.

3. The phase-locked loop of claim 1, wherein the signal derived from the selected one of the first and second oscillator signals comprises a signal having a frequency equal to a divisor of the frequency of the second selected one of the first and second oscillator signals.

4. The phase-locked loop of claim 3, further comprising a second frequency divider operable to receive the second selected one of the first and second oscillator signals, and operable to generate therefrom the signal having a frequency equal to a divisor of the frequency of the second selected one of the first and second oscillator signals.

5. The phase-locked loop of claim 1, wherein the frequency divider comprises:

a plurality of frequency divide blocks, wherein a first one of the frequency divider blocks is operable to receive the first selected one of the first and second oscillator signals, and wherein each other one of the frequency divide blocks is operable to receive an output signal from a preceding one of the frequency divide blocks; and a multiplexer system operable to receive an output signal from at least one of the frequency divide blocks, and operable to receive the select signal from the control block, and operable to receive the first selected one of the first and second oscillator signals, and operable to provide a selected one of the output signals from the frequency divide blocks as the output signal of the frequency divider in response to the select signal, and operable to synchronize the output signal to the first selected one of the first and second oscillator signals.

6. The phase-locked loop of claim 5, wherein the multiplexer system of the frequency divider is further operable to receive the first selected one of the first and second oscillator signals, and operable to select the first selected one of the first and second oscillator signals as the output signal of the frequency divider in response to the select signal.

7. A method for synchronizing a variable-frequency signal to a reference signal, comprising:

generating the variable-frequency signal by a variable-frequency oscillator;

receiving a first selected one of the variable-frequency signal and the reference signal at a frequency divider;

generating a plurality of frequency-divided signals by the frequency divider in response to the first selected one of the variable-frequency signal and reference signal receiving a frequency divide ratio select signal at the frequency divider;

selecting one of the plurality of frequency-divided signals as an output signal by the frequency divider in response to the frequency divide ratio select signal;

synchronizing the output signal with the first selected one of the variable-frequency signal and the reference signal by the frequency divider;

receiving both the output signal of the frequency divider and a second selected one of the variable-frequency signal and the reference signal at a frequency comparator;

comparing the frequencies of the output signal of the frequency divider and the second selected one of the variable-frequency signal and the reference signal by the frequency comparator;

generating by the comparator a frequency error signal in response to the comparison of the frequencies of the output signal of the frequency divider and the second selected one of the variable-frequency signal and the reference signal;

receiving the frequency error signal at the variable-frequency oscillator; and adjusting the frequency of the variable-frequency signal by the variable-frequency oscillator in response to the frequency error signal.

8. The method of claim 7, wherein generating a plurality of frequency-divided signals and selecting one of the plurality of frequency-divided signals as an output signal by the frequency divider comprises:

receiving the first selected one of the variable-frequency signal and the reference signal at a first frequency divide block of the frequency divider;

receiving as an input signal at each one of a plurality of frequency divide blocks an output signal from a previous one of the frequency divide blocks;

generating by each frequency divide block an output signal having a frequency proportionally less than a frequency of the input signal of the frequency divide block in accordance with a predetermined divide ratio;

receiving a plurality of the frequency divide block output signals at a multiplexer;

receiving the frequency divide ratio select signal at the multiplexer; and selecting one of the frequency divide block output signals as an output signal by the multiplexer in response to the frequency divide ratio select signal.

9. The method of claim 8, wherein synchronizing the output signal with the first selected one of the variable-frequency signal and the reference signal by the frequency divider comprises:

receiving the first selected one of the variable-frequency signal and the reference signal at the multiplexer as a clock signal; and synchronizing the output signal of the multiplexer to the clock signal.

10. A frequency divider comprising:

an input port operable to receive an oscillating input signal;

a plurality of frequency divide blocks connected in series, a first one of the frequency divide blocks being coupled to the input port and operable to receive the input signal, each frequency divide block being operable to receive a block input signal and generate a block output signal having a frequency less than a frequency of the block input signal by a selected frequency reduction ratio;

a multiplexer system operable to receive a plurality of the block output signals, and operable to receive a select signal, and operable to provide a selected one of the block output signals as an output signal of the multiplexer system in response to the select signal; and a retiming device coupled to the multiplexer system, the retiming device being operable to receive the output signal of the multiplexer system, and operable to receive a signal selected from a group comprising the oscillating input signal and the block output signals, and operable to generate an output signal of the frequency divider corresponding to the output signal of the multiplexer system, the output signal of the frequency divider being synchronized by the retiming device with the signal selected from the group comprising the oscillating input signal and the block output signals.

11. The frequency divider of claim 10, wherein the first frequency divide block comprises a frequency predivide block having a frequency reduction ratio greater than three.

12. The frequency divider of claim 10, wherein each one of the frequency divide blocks comprises a flip-flop.

13. The frequency divider of claim 10, wherein the retiming device comprises a flip-flop.

* * * * *